United States Patent
Tsuboi et al.

(10) Patent No.: US 7,663,193 B2
(45) Date of Patent: *Feb. 16, 2010

(54) SEMICONDUCTOR DEVICE AND MANUFACTURING METHOD THEREOF FOR REDUCING THE AREA OF THE MEMORY CELL REGION

(75) Inventors: Nobuo Tsuboi, Tokyo (JP); Motoshige Igarashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/237,693

(22) Filed: Sep. 25, 2008

(65) Prior Publication Data

US 2009/0026520 A1  Jan. 29, 2009

Related U.S. Application Data

(63) Continuation of application No. 11/541,656, filed on Oct. 3, 2006, now Pat. No. 7,439,153.

(30) Foreign Application Priority Data

Oct. 7, 2005 (JP) ............................. 2005-295258

(51) Int. Cl.
    *H01L 21/00* (2006.01)
(52) U.S. Cl. .................. 257/369; 257/506; 257/314
(58) Field of Classification Search ................ 257/314, 257/506, 369
    See application file for complete search history.

(56) References Cited

U.S. PATENT DOCUMENTS

| 5,610,419 | A | 3/1997 | Tanaka |
| 6,169,313 | B1 | 1/2001 | Tsutsumi et al. |
| 6,232,631 | B1 | 5/2001 | Schmidt et al. |
| 6,339,240 | B1 | 1/2002 | Kim |
| 6,555,868 | B2 * | 4/2003 | Shimizu et al. ............. 257/315 |
| 6,720,628 | B2 | 4/2004 | Karasawa et al. |
| 7,119,389 | B2 | 10/2006 | Lee et al. |
| 7,439,153 | B2 * | 10/2008 | Tsuboi et al. ............... 438/404 |
| 2002/0009846 | A1 * | 1/2002 | Shimizu et al. ............. 438/230 |
| 2002/0135027 | A1 | 9/2002 | Karasawa et al. |
| 2004/0004257 | A1 | 1/2004 | Lee et al. |
| 2004/0212019 | A1 * | 10/2004 | Shinohara et al. .......... 257/368 |

(Continued)

FOREIGN PATENT DOCUMENTS

JP          10-178110          6/1998

(Continued)

*Primary Examiner*—Laura M Menz
(74) *Attorney, Agent, or Firm*—McDermott Will & Emery LLP

(57) ABSTRACT

A structure is adopted for a layout of an SRAM cell which provides a local wiring 3*a* between a gate 2*a* and gate 2*b* and connects an active region 1*a* and an active region 1*b*. This eliminates the necessity for providing a contact between the gate 2*a* and the gate 2*b*. Therefore, it is possible to reduce the size of a memory cell region C in a short side direction. Furthermore, a structure whereby a left end of a gate 2*c* is retreated from the gate 2*a* and a local wiring 3*b* which connects the active region 1*b* and gate 2*c* disposed in a diagonal direction is adopted. This allows the gate 2*a* to be shifted toward the center of the memory cell region C.

5 Claims, 17 Drawing Sheets

U.S. PATENT DOCUMENTS

| | | | |
|---|---|---|---|
| 2006/0006474 A1* | 1/2006 | Tsuboi | 257/369 |
| 2006/0228860 A1* | 10/2006 | Shinohara et al. | 438/257 |
| 2007/0026603 A1 | 2/2007 | Lee et al. | |
| 2007/0080423 A1* | 4/2007 | Tsuboi et al. | 257/506 |
| 2007/0176214 A1 | 8/2007 | Kwon et al. | |
| 2007/0187721 A1 | 8/2007 | Ahn et al. | |
| 2008/0042218 A1 | 2/2008 | Igarashi et al. | |
| 2009/0026520 A1* | 1/2009 | Tsuboi et al. | 257/314 |

FOREIGN PATENT DOCUMENTS

| | | |
|---|---|---|
| JP | 2001-196472 | 7/2001 |
| JP | 2003-203993 | 7/2003 |
| JP | 2005-123243 | 5/2005 |
| JP | 2005-191454 | 7/2005 |

* cited by examiner

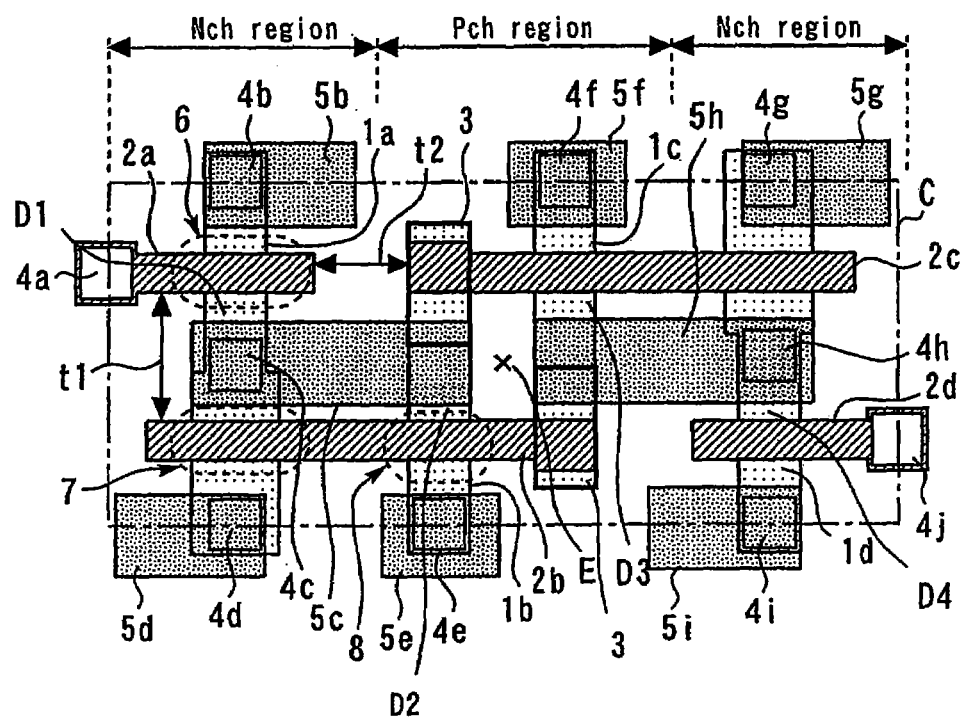
FIG. 17 – *PRIOR ART* –

SEMICONDUCTOR DEVICE AND MANUFACTURING METHOD THEREOF FOR REDUCING THE AREA OF THE MEMORY CELL REGION

RELATED APPLICATIONS

This application is a Continuation of U.S. application Ser. No. 11/541,656, filed Oct. 3, 2006 now U.S. Pat. No. 7,439,153, claiming priority of Japanese Application No. 2005-295258, filed Oct. 7, 2005, the entire contents of each of which are hereby incorporated by reference.

BACKGROUND OF THE INVENTION

1. Field of the Invention

The present invention relates to a semiconductor device and manufacturing method thereof, and more particularly, to the structure of an SRAM and manufacturing method thereof.

2. Background Art

With an increase in the degree of integration of a semiconductor device, the size of a semiconductor memory represented by SRAM (Static Random Access Memory) or the like is becoming smaller. In line with this, the size and wiring pitch of elements mounted in the semiconductor memory are becoming smaller.

In Japanese Unexamined Patent Publication No. 10-178110, a layout for reducing a cell area of an SRAM made up of CMOS devices whose one bit consists of 6 transistors is disclosed.

FIG. 17 shows a general layout of the above described SRAM. This figure shows a memory corresponding to one bit of the SRAM. Each element is disposed so as to be symmetric with respect to a center point E.

Active regions 1a to 1d are provided inside a memory cell region C. A gate 2a is disposed so as to cross the active region 1a and a gate 2b is disposed so as to cross the active regions 1a, 1b. A shared contact (hereinafter referred to as "SC") 3 is provided so as to connect the active region 1b and gate 2c. The gate 2a is provided with a contact 4a. The active region 1a is provided with contacts 4b, 4c and 4d. The active region 1b is provided with a contact 4e. Metal wirings 5b, 5c, 5d and 5e are provided so as to cover the contacts 4b, 4c, 4d and 4e respectively. The active region 1a is connected to the active region 1b through the contact 4c, metal wiring 5b and SC3. The active region 1b is connected to the gate 2c through the SC3.

In the above described semiconductor device, the contact 4c is disposed between the gate 2a and gate 2b. For this reason, it is difficult to shorten a distance $t_1$ between the gate 2a and gate 2b.

SUMMARY OF THE INVENTION

The present invention has been developed to solve the above-described problems, and therefore it is an object of the present invention to provide a semiconductor device and manufacturing method thereof to reduce the area of a memory cell region of a semiconductor device provided with wirings in an area between two gates in the memory cell region.

The above object is achieved by a semiconductor device that includes a first active region provided inside a memory cell region on a substrate, a second active region separated from the first active region by an element isolator, provided at a position closer to a center of the memory cell region than the first active region, a first gate electrode which crosses the first active region, a second gate electrode which is separated from the first gate electrode and crosses the first active region and the second active region, a first drain section between the first gate electrode and the second gate electrode in the first active region, a second drain section provided at the position of the same side of the first drain toward the second gate electrode in the second active region, a first wiring which connects the first drain section and the second drain section, a third gate electrode separated from the first gate electrode and the second gate electrode, an end of which is opposed to an end of the first gate electrode on the second active region side, and a second wiring which connects the second drain section and the third gate electrode, and no contact for connecting the first wiring to a wiring in a higher layer is provided between the first gate electrode and the second gate electrode.

The above object is achieved by a method of manufacturing a semiconductor device that includes steps of forming a first active region and a second active region which is separated from the first active region by an element isolator and provided at a position closer to a center of the memory cell region than the first active region, in a memory cell region on a substrate, a step of forming a first gate electrode which crosses the first active region, a second gate electrode which is separated from the first gate electrode and crosses the first active region and the second active region and a third electrode which is separated from the first gate electrode and the second gate electrode, an end of which is opposed to an end of the first gate electrode on the second active region side and retreated from the first gate electrode more than an end of the second active region opposed to the first gate electrode, a step of forming a first drain section between the first gate electrode and the second gate electrode in the first active region and a second drain section at the position of the same side of the first drain toward the second gate electrode in the second active region, a step of forming a first wiring which connects the first drain section and the second drain section, and a step of forming a second wiring which connects the second drain section and the third gate electrode.

According to the present invention, for a semiconductor device provided with wiring in an area between two gates in a memory cell region, a structure with no contacts provided for connecting the above described wiring to wirings in higher layers, and can thereby reduce the area of a memory cell.

Other features and advantages of the invention will be apparent from the following description taken in connection with the accompanying drawings.

BRIEF DESCRIPTION OF DRAWINGS

FIG. 17 is a plane view of the conventional semiconductor device.

DETAILED DESCRIPTION OF THE PREFERRED EMBODIMENTS

Figure 1A:
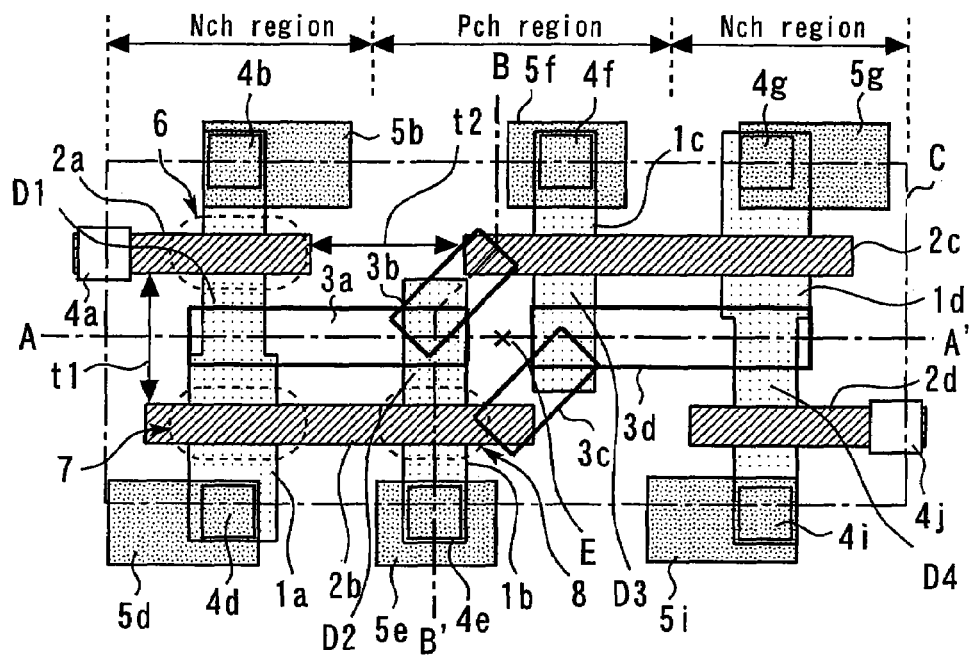
FIG. 1A is a plane view of the semiconductor device according to the first embodiment.

Embodiments of the present invention will be described below referring to the drawings. In the drawings, the same or equivalent parts will be denoted by the same reference numerals, and the description thereof will be simplified or omitted.

First Embodiment

A plane view of the semiconductor device according to this embodiment is shown in FIG. 1A. This semiconductor device is a CMOS static random access memory (hereinafter referred to as "SRAM"), 1 bit of which is made up of six transistors. A 1-bit cell memory of this SRAM is disposed inside the memory cell region C. The respective elements are arranged so as to be symmetric with respect to a center point E of this region. Hereinafter, explanations of parts symmetric with respect to a point will be simplified or omitted.

The memory cell region includes an N-type channel region (hereinafter referred to as "Nch region") where N-type transistors are arranged and P-type channel region (hereinafter referred to as "Pch region") where P-type transistors are arranged. The Pch region is provided in the central area of the memory cell region C. The Nch regions are provided on both sides thereof. Active regions $1a$, $1d$ are provided in the Nch regions while active regions $1b$, $1c$ are provided in the Pch region. The active region $1b$ is separated from the active region $1a$ and closer to the center of the memory cell region C than the active region $1a$.

A gate $2a$ is provided so as to cross the active region $1a$. The active region $1a$ and gate $2a$ constitute an access transistor 6. A gate $2b$ is provided apart from the gate $2a$ so as to cross the active region $1a$ and active region $1b$. The active region $1a$ and gate $2b$ constitute a drive transistor 7. The active region $1b$ and gate $2b$ constitute a load transistor 8. A gate $2c$ is provided so as to cross the active region $1c$ and active region $1d$. The left end of the gate $2c$ is opposed to the right end of the gate $2a$ and provided at a position more retreated from the gate $2a$ than the left end of the active region $1b$.

A local wiring $3a$ is provided so as to connect the active region $1a$ and active region $1b$. A local region $3b$ is provided so as to connect the active region $1b$ and gate $2c$. The local wiring $3b$ forms a predetermined angle (approximately 45°) with respect to the longitudinal direction of the local wiring $3a$.

A drain $D_1$ is provided between the gate $2a$ and gate $2b$ in the active region $1a$. A drain $D_2$ is provided at a position in the active region $1b$ contacting the side of the gate $2b$ on the drain $D_1$ side. In other words, a drain $D_2$ is provided at a position of the same side of the drain $D_1$ toward the gate $2b$. A drain $D_4$ is provided between the gate $2c$ and gate $2d$ in the active region $1d$. A drain $D_3$ is provided on the drain $D_4$ side of the gate $2c$ in the active region $1c$.

A contact $4b$ is provided at a position in the active region $1a$ opposite the local wiring $3a$ with the gate $2a$ placed in between. A wiring $5b$ is provided so as to cover the contact $4b$. A contact $4d$ is provided at a position in the active region $1b$ opposite the local wiring $3a$ with the gate $2b$ placed in between. A wiring $5d$ is provided so as to cover the contact $4d$. A contact $4e$ is provided at a position in the active region $1b$ opposite the local wiring $3a$ with the gate $2b$ placed in between. A wiring $5e$ is provided so as to cover the contact $4e$.

Figure 1B:
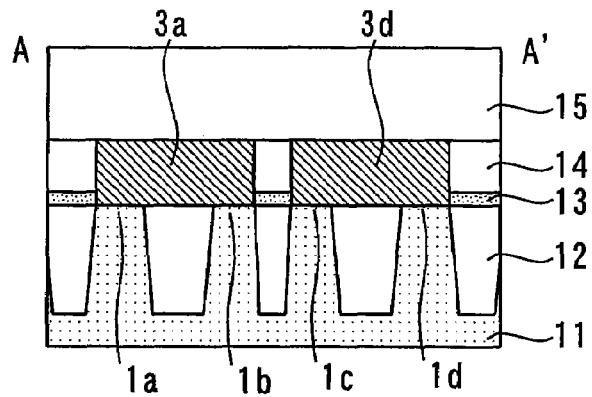
FIG. 1B is a cross sectional view along A-A' shown in FIG. 1A.

FIG. 1B shows a cross section along A-A' shown in FIG. 1A. The active regions $1a$ to $1d$ are provided on the surface of a silicon substrate 11. The respective active regions are separated from each other through an element isolator 12. A liner film 13 made of a silicon nitride film is provided on the silicon substrate 11. A first inter-layer insulating film 14 made of a silicon oxide film is provided thereupon. Local wirings $3a$ and $3d$ are provided in the liner film 13 and first inter-layer insulating film 14. The local wiring $3a$ connects the drain $D_1$ (active region $1a$) and drain $D_2$ (active region $1b$). The local wiring $3d$ connects the drain $D_3$ (active region $1c$) and drain $D_4$ (active region $1d$).

A second inter-layer insulating film 15 made of a silicon oxide film is provided on the first inter-layer insulating film 14 and local wirings $3a$, $3d$.

Figure 1C:
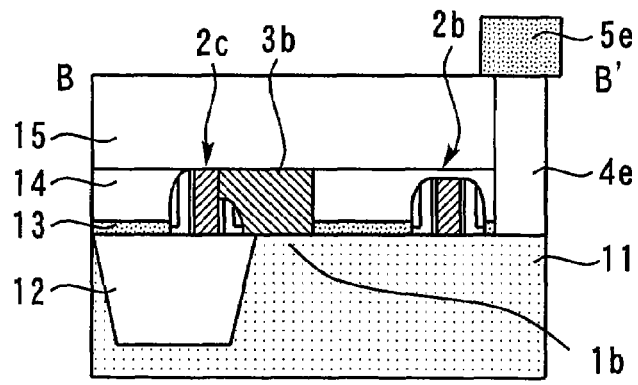
FIG. 1C is a cross sectional view along B-B' shown in FIG. 1A.

FIG. 1C shows a cross section along B-B' shown in FIG. 1A. The gate $2c$ is provided on the element isolator 12 and the gate $2b$ is provided on the active region $1b$. The first inter-layer insulating film 14 is formed at substantially the same height as the gates $2b$, $2c$. The local wiring $3b$ is provided inside the first inter-layer insulating film 14. One side of the local wiring $3b$ contacts one side of the gate $2c$. The bottom face of the local wiring $3b$ contacts the drain $D_2$ (active region $1b$). That is, the local wiring $3b$ connects the gate $2c$ and drain $D_2$.

The contact $4e$ is provided so as to penetrate the second inter-layer insulating film 15, first inter-layer insulating film 14 and liner film 13. The bottom face of the contact $4e$ is connected to the active region $1b$. The wiring $5e$ is provided on the contact $4e$.

As shown in FIG. 1B, this embodiment adopts a structure whereby the drain $D_1$ (active region 1a) and drain $D_2$ (active region 1b) are connected by the local wiring 3a. That is, no contact is provided between the gate 2a and gate 2b for connection with a wiring in a higher layer than the local wiring 3a.

This allows the distance $t_1$ between the gate 2a and gate 2b to be smaller than that in the conventional art. Therefore, it is possible to reduce the size of the memory cell in the short side direction. According to this embodiment, it is possible to reduce the size in the short side direction by approximately 13%.

Furthermore, as described above, a structure is adopted whereby the left end of the gate 2c is located at a position more retreated from the gate 2a than the left end of the active region 1b. Moreover, a structure is adopted whereby the local wiring 3b is disposed in a direction diagonal to the longitudinal direction of the local wiring 3a and the drain $D_2$ (active region 1b) and gate 2c are connected.

Adopting such a structure allows the gate 2a to be shifted rightward while keeping the distance $t_2$ between the gate 2a and gate 2c constant. That is, the gate 2a can be shifted toward the center of the memory cell region C.

Therefore, the size of the memory cell region C in the long side direction can be reduced. According to this embodiment, the size in the long side direction can be reduced by approximately 8%.

As described above, adopting the structure shown in FIG. 1 can reduce the size of the memory cell in the short side direction by approximately 13%. Furthermore, it is possible to reduce the size of the memory cell in the long side direction by approximately 8%. Therefore, reducing sizes of the memory cell in both the short side direction and long side direction can reduce the cell area by approximately 20%.

Next, the method of manufacturing the semiconductor device shown in FIG. 1 will be explained with reference to FIG. 2 to FIG. 4. "A" in these figures shows a plane view corresponding to FIG. 1A. Furthermore, "B" and "C" in these figures show sectional views corresponding to FIGS. 1B and 1C respectively.

First, the surface of a silicon substrate is selectively etched and a trench is formed. Next, a silicon oxide film is embedded inside the trench and an element isolator is formed. Next, impurities are selectively implanted into the principal surface of the silicon substrate. As a result, as shown in FIG. 2 A, active regions 1a, 1d are formed in the Nch region. Furthermore, the active regions 1b and 1c are formed in the Pch region. The active region 1b is separated from the active region 1a through the element isolator and formed at a position closer to the center point E of the memory cell region C than the active region 1a.

Figure 2A:
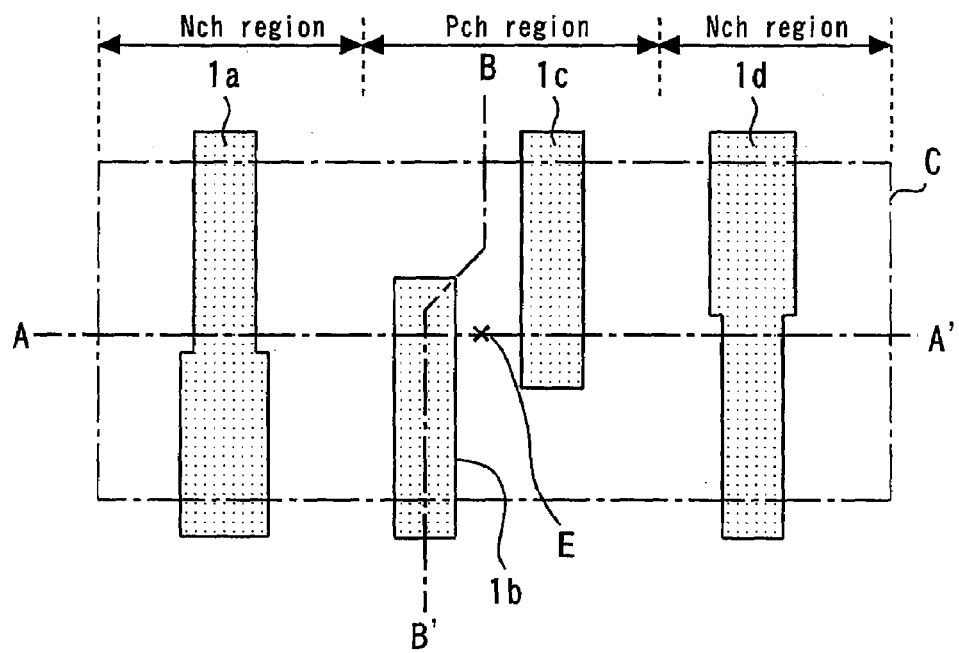
FIGS. 2A, 3A, 4A and 5A are plane views of the semiconductor device showing the method of manufacturing the semiconductor device according to the first embodiment.
Figure 2B:
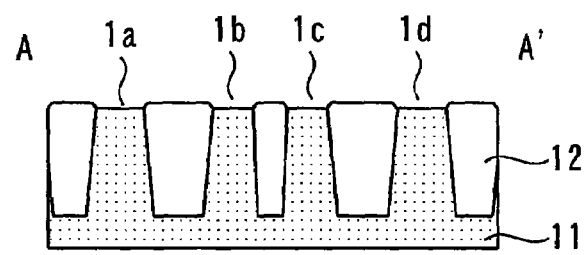
FIGS. 2B, 3B, 4B and 5B are cross sectional views along A-A' shown in FIGS. 2A, 3A, 4A and 5A respectively.
Figure 2C:
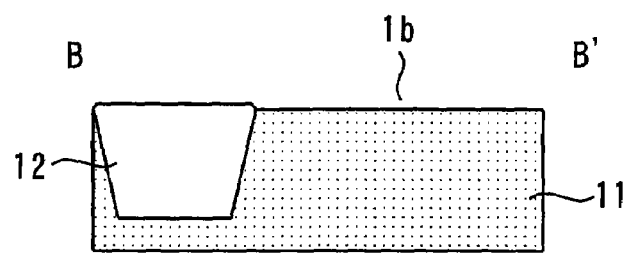
FIGS. 2C, 3C, 4C and 5C are cross sectional views along B-B' shown in FIGS. 2A, 3A, 4A and 5A respectively.

At this time, as shown in FIG. 2B, the active regions 1a to 1d are separated through the element isolator 12. Furthermore, as shown in FIG. 2C, the active region 1b and element isolator 12 are formed on the principal plane of the silicon substrate 11.

Next, gates are formed so as to cross the active regions 1a to 1d shown in FIG. 2A. Next, nickel silicide (NiSi) is formed on the surface of the gate, on the surfaces of the active regions 1a to 1d. As a result, the gates 2a to 2d are formed as shown in FIG. 3.

The gate 2a is formed so as to cross the active region 1a. The gate 2b is formed so as to be separated from the gage 2a and cross the active region 1a and active region 1b. The left end of the gate 2c is opposed to the right end of the gate 2a and formed so as to retreat from the gate 2a more than the left end of the active region 1b.

Next, ion-injection of impurities and thermal treatment are performed. As a result, as shown in FIG. 3 A, the drain $D_1$ is formed between the gate 2a and gate 2b in the active region 1a. Furthermore, the drain $D_2$ is formed at a position in the active region 1b contacting the side of the gate 2b on the drain $D_1$ side. In other words, a drain $D_2$ is formed at a position of the same side of the drain $D_1$ toward the gate 2b.

Figure 3A:
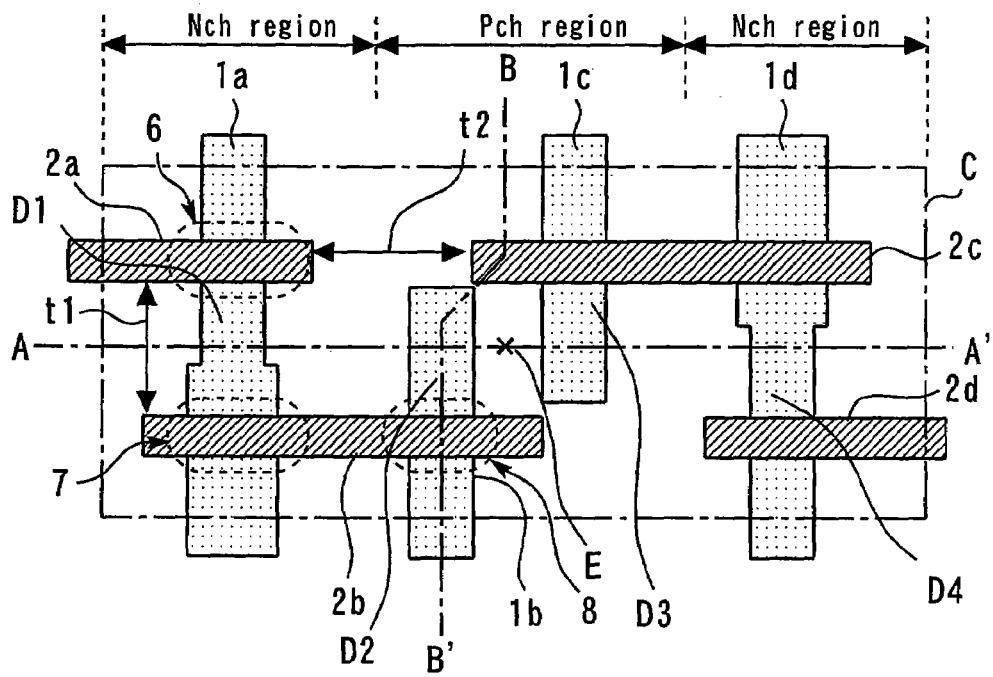
Figure 3B:
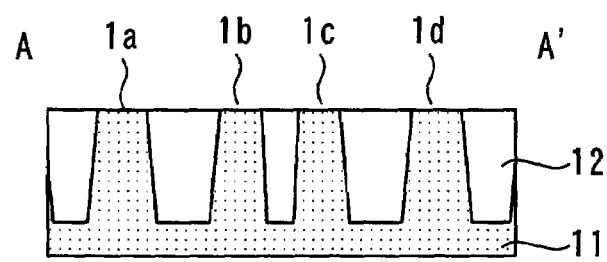
Figure 3C:
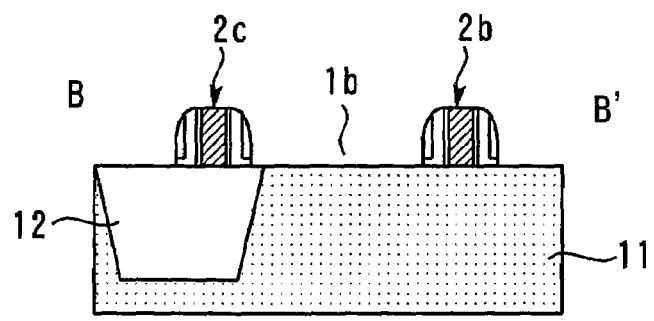

Next, the liner film made of a silicon nitride film is formed on the silicon substrate 11 shown in FIGS. 3B, 3C to a film thickness of approximately 30 nm. Next, the first inter-layer insulating film made of a silicon oxide film is formed to the height of the gates 2a to 2d or to a greater film thickness. Next, the first inter-layer insulating film and liner film are selectively etched to form grooves.

Next, a titanium nitride (TiN) film is formed as a barrier metal that covers the bottom face and the side of the grooves, and tungsten (W) is embedded in the interior thereof to form a conductive film. It is also possible to use tantalum nitride (TaN) as the above described barrier metal and embed copper (Cu) in the interior thereof to form a conductive film.

Next, the whole surface of this conductive film is etched back and the conductive film of the exterior of the grooves is removed. Here, instead of etching back, it is also possible to remove the conductive film outside the grooves through chemical mechanical polishing (hereinafter referred to as "CMP").

As a result, as shown in FIG. 4, the local wirings 3a to 3d are formed in the liner film 13 and first inter-layer insulating film 14.

Figure 4A:
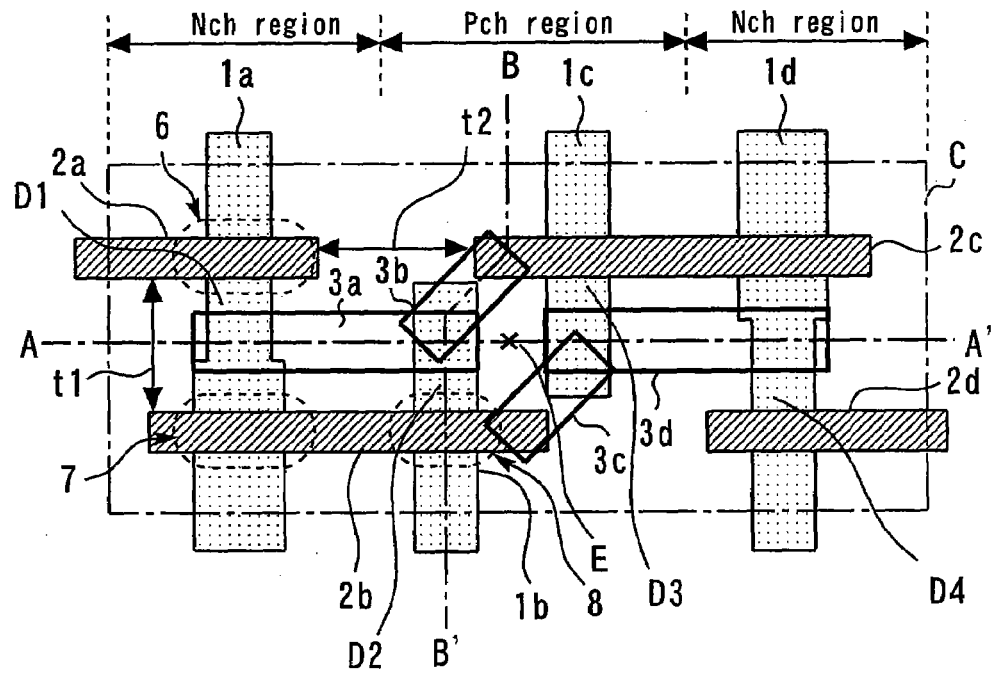
Figure 4B:
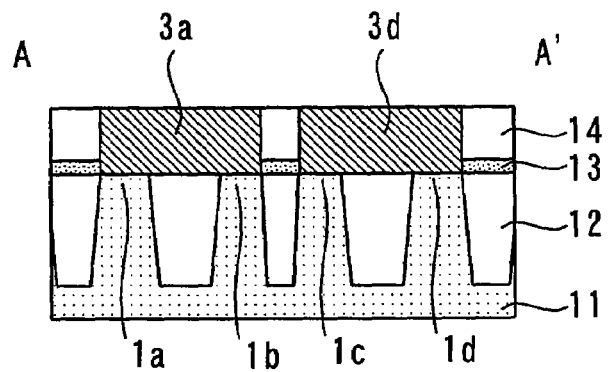

At this time, as shown in FIG. 4B, the local wiring 3a connects the drain $D_1$ (active region 1a) and drain $D_2$ (active region 1b). For this reason, there is no need to form contacts between the gate 2a and gate 2b to connect a wiring in a higher layer than the local wiring 3a. This allows the distance $t_1$ between the gate 2a and gate 2b to be reduced compared to the conventional art. Therefore, the size of the memory cell in the short side direction can be reduced.

Figure 4C:
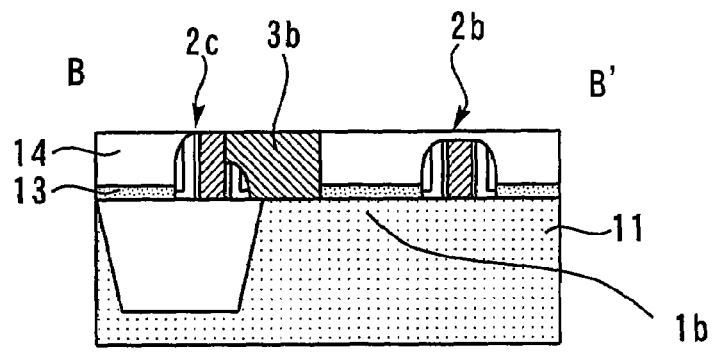

Furthermore, as shown in FIG. 4C, the local wiring 3b connects the drain $D_2$ (active region 1b) and gate 2c. The local wiring 3b is disposed diagonally with respect to the longitudinal direction of the local wiring 3a. Adopting such a structure makes it possible to shift the gate 2a rightward while keeping the distance $t_2$ between the gate 2a and gate 2c constant. That is, the gate 2a can be shifted toward the center of the memory cell region C.

Therefore, the size of the memory cell region C in the long side direction can be reduced.

Figure 5A:
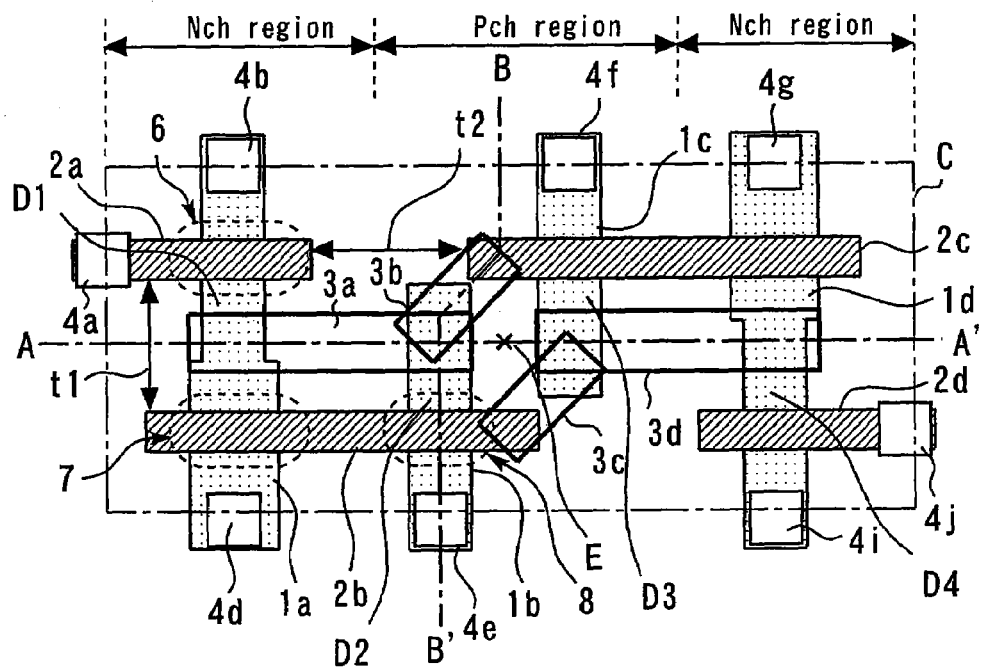

Next, the second inter-layer insulating film made of a silicon oxide film is formed on the first inter-layer insulating film 14 and local wirings 3a, 3d shown in FIGS. 4B, 4C to a film thickness of approximately 300 to 400 nm. Next, the surface of this film is planarized through CMP. Next, the second inter-layer insulating film, first inter-layer insulating film 14 and liner film 13 are selectively etched to open contact holes. A barrier metal film made of TiN or the like is formed on the inner surface thereof and a conductive film such as a W film is embedded. Next, the barrier metal film, conductive film or the like formed outside the contact are removed through CMP or the like. As a result, as shown in FIG. 5, contacts 4a, 4b, 4d, 4e, 4f, 4g, 4i and 4j are formed.

Figure 5B:
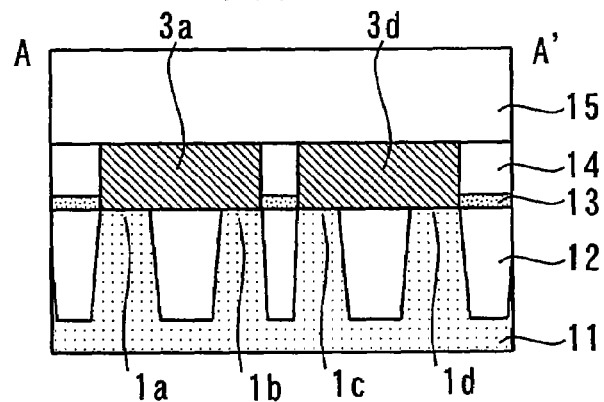
Figure 5C:
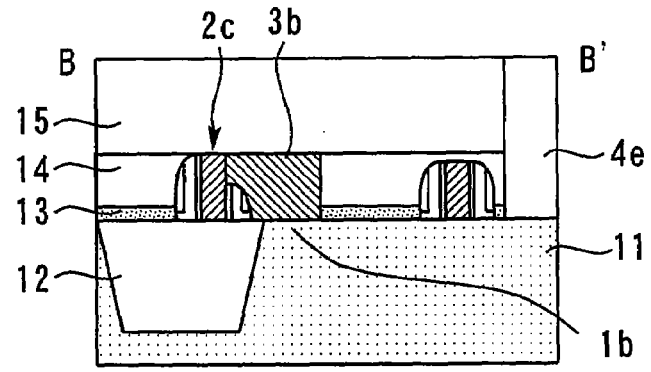

Next, a conductive film made of aluminum or the like is formed on the whole surface of the second inter-layer insulating film 15 shown in FIGS. 5B, 5C. Next, this conductive film is selectively etched. As a result, as shown in FIG. 1A, wirings 5a, 5b, 5d, 5e, 5f, 5g, 5i and 5j are formed on the contacts 4a, 4b, 4d, 4e, 4f, 4g, 4i and 4j respectively.

According to the manufacturing method according to this embodiment, it is possible to reduce the size of the memory cell in the short side direction by approximately 13%. Furthermore, it is possible to reduce the size of the memory cell in the long side direction by approximately 8%. Thus, by reducing both sizes in the short side and long side directions of the memory cell, it is possible to reduce the cell area by approximately 20%.

Next, a modification example of the semiconductor device shown in this embodiment will be explained.

Figure 6:
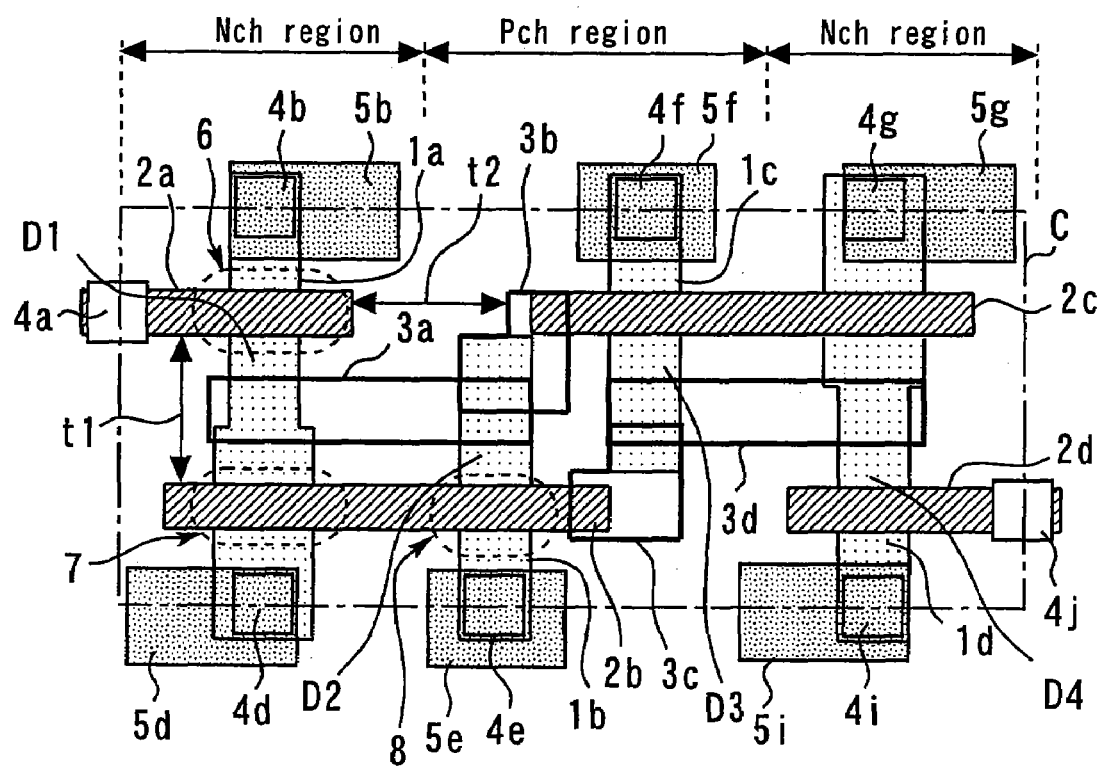
FIG. 6 is a plane view of the semiconductor device according to a modification example of the first embodiment.

In the plane view of the semiconductor device shown in FIG. 1A, the local wiring 3b is disposed so as to form a predetermined angle (approximately 45°) with respect to the longitudinal direction of the local wiring 3a. However, the local wiring 3b may also have an L-figured shape as shown in FIG. 6. In this case, the local wiring 3b can also connect the local wiring 3a and gate 2c. Therefore, the same effect as that of this embodiment can be obtained.

Second Embodiment

Figure 7A:
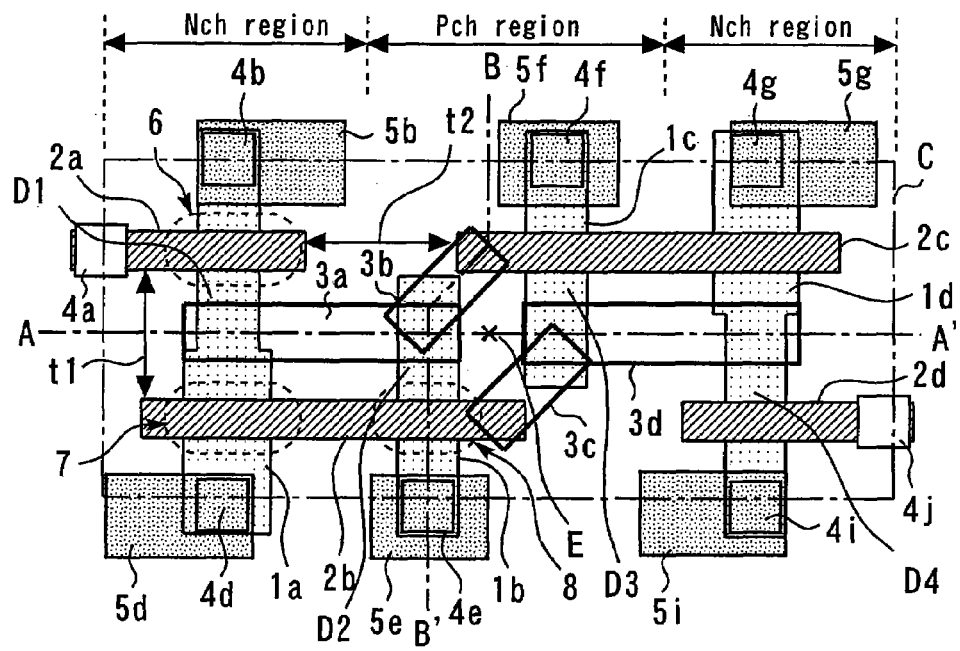
FIG. 7A is a plane view of the semiconductor device according to the second embodiment.
Figure 7B:
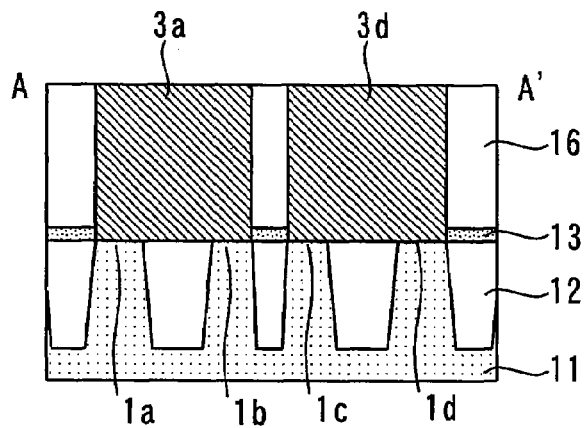
FIG. 7B is a cross sectional view along A-A' shown in FIG. 7A.
Figure 7C:
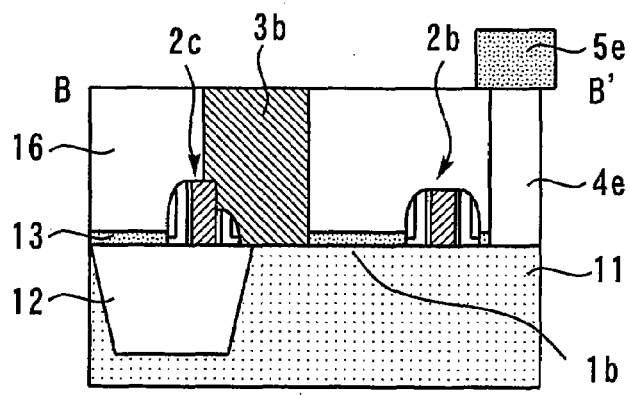
FIG. 7C is a cross sectional view along B-B' shown in FIG. 7A.

A plane view of a semiconductor device according to this embodiment is shown in FIG. 7A. FIG. 7B shows a sectional view along A-A' of FIG. 7A. FIG. 7C shows a sectional view along B-B' of FIG. 7A. Here, differences from First Embodiment will be mainly explained.

As shown in FIG. 7B, a third inter-layer insulating film 16 made of a silicon oxide film is formed on a liner film 13. Local wirings 3a, 3d are provided inside the liner film 13 and third inter-layer insulating film 16. The top surface of the third inter-layer insulating film 16 and the top surfaces of the local wirings 3a, 3d have substantially the same height.

As shown in FIG. 7C, a shared contact 3b is formed inside the liner film 13 and third inter-layer insulating film 16. This corresponds to the local wiring 3b shown in First Embodiment (FIG. 1C). The top surface of the third inter-layer insulating film 16, the top surface of the shared contact 3b and the top surface of the contact 4e have substantially the same height.

From FIGS. 7B, 7C, the local wirings 3a, 3d, shared contract 3b and contact 4e are formed to substantially the same height. That is, these are formed of the same layer.

Other parts of the configuration are the same as those of First Embodiment and explanations thereof will be omitted.

Adopting the above described structure allows lithography for forming the local wiring 3a, shared contact 3b and contact 4e to be performed with a single operation. This makes it possible to reduce the total number of mask layers and also reduce the number of the process steps.

Next, the method of manufacturing the semiconductor device shown in FIG. 7 will be explained with reference to FIG. 8.

Figure 8A:
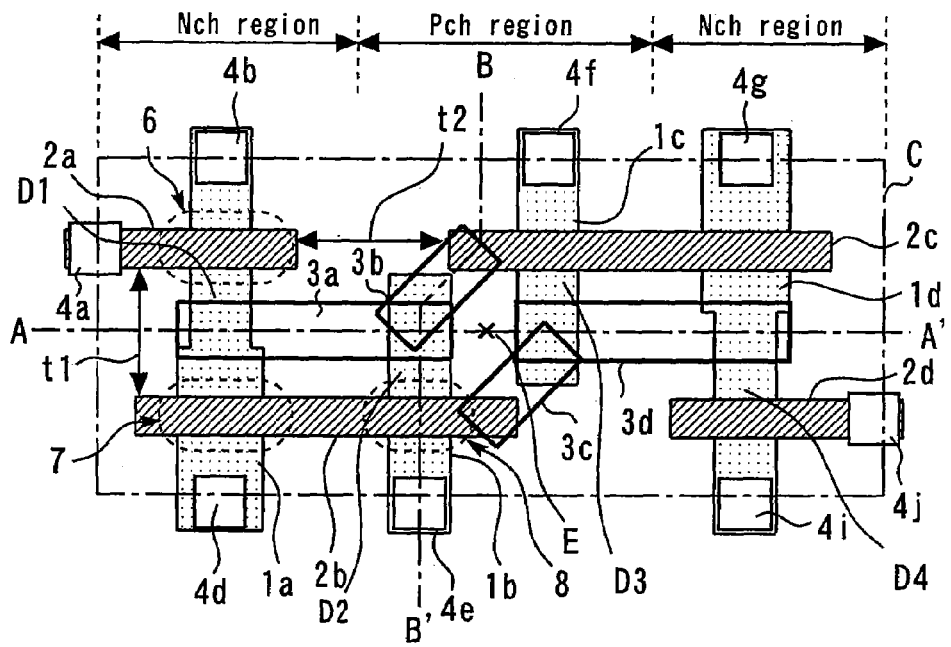
FIG. 8A is a plane view of the semiconductor device showing the method of manufacturing the semiconductor device according to the second embodiment.
Figure 8B:
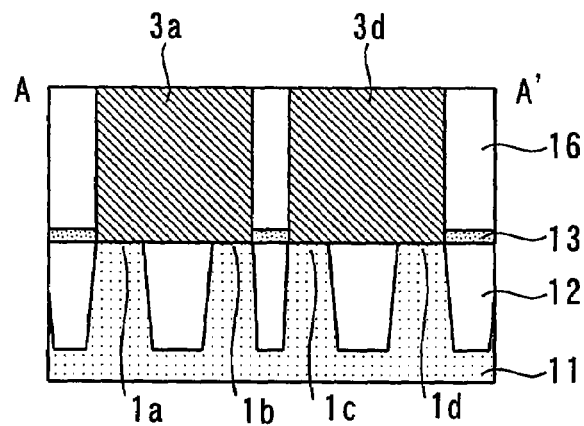
FIG. 8B is a cross sectional view along A-A' shown in FIG. 8A.
Figure 8C:
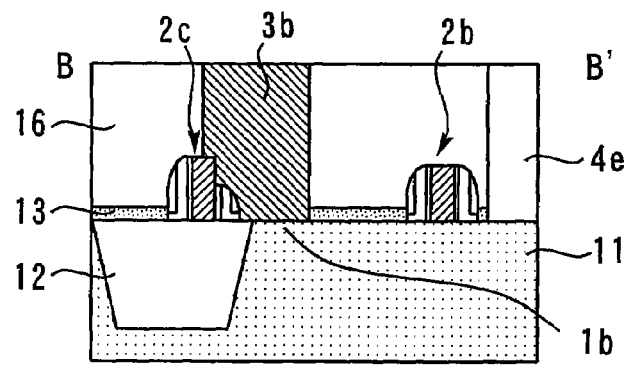
FIG. 8C is a cross sectional view along B-B' shown in FIG. 8A.

FIG. 8 shows a plane view of the parts corresponding to those of FIG. 7A. Furthermore, FIGS. 8B, 8C are sectional views corresponding to FIGS. 7B, 7C respectively.

First, steps of forming a trench (see FIGS. 2A, 2B and 2C) to steps of forming gates 2a to 2d (see FIGS. 3A, 3B and 3C) will be performed using a method similar to that shown in First Embodiment. Next, as in the case of First Embodiment, a liner film is formed on the silicon substrate 11 shown in FIGS. 3B, 3C. A third inter-layer insulating film made of a silicon oxide film is formed on top of it to a film thickness of approximately 300 to 400 nm. Next, the third inter-layer insulating film and liner film are selectively etched to form grooves.

Next, a titanium nitride (TiN) film is formed as a barrier metal to cover the bottom face and side of these grooves and tungsten (W) is embedded in the interior thereof to form a conductive layer. It is also possible to use tantalum nitride (TaN) as the above described barrier metal and embed copper (Cu) in the interior thereof to form a conductive layer.

Next, this conductive layer is etched back and the conductive layer outside the grooves is removed. Here, instead of etching back, CMP may be used to remove the conductive layer outside the grooves.

As a result, as shown in FIG. 8, the local wirings 3a, 3d, shared contact 3b and contact 4e are formed inside the liner film 13 and third inter-layer insulating film 16.

According to the manufacturing method of this embodiment, local wirings, shared contact (corresponding to the local wiring 3b of First Embodiment), and contacts are formed simultaneously. Therefore, in addition to the effects obtained in First Embodiment, the number of steps can be reduced more than First Embodiment.

After this, the metal wirings are formed in the same way as First Embodiment. As a result, the structure shown in FIG. 7 is obtained.

Third Embodiment

Figure 9A:
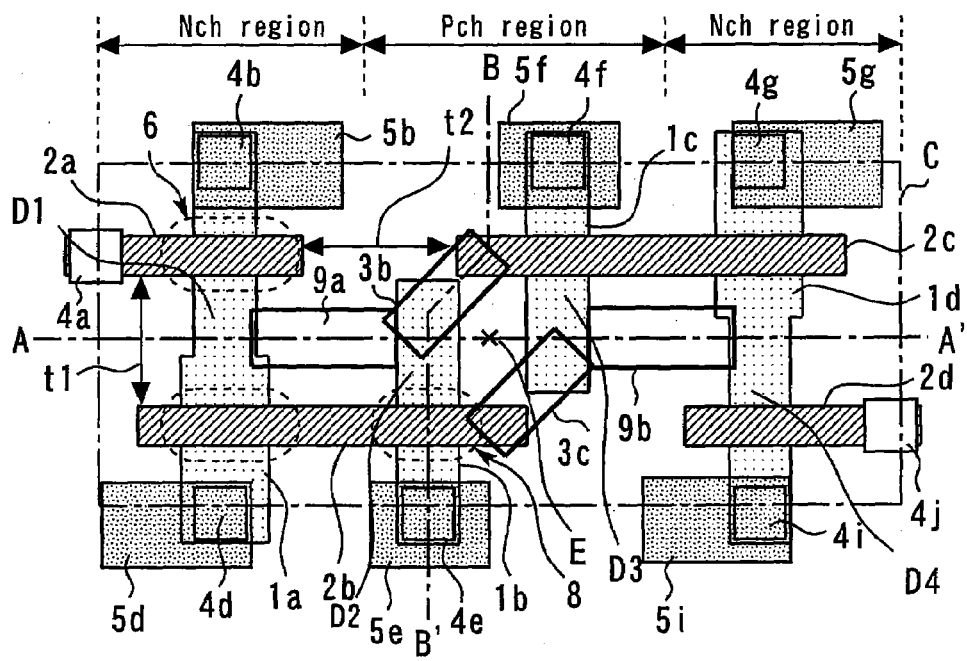
FIG. 9A is a plane view of the semiconductor device according to the third embodiment.
Figure 9B:
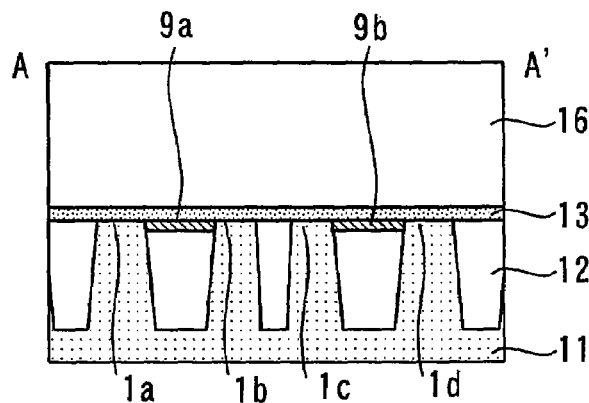
FIG. 9B is a cross sectional view along A-A' shown in FIG. 9A.
Figure 9C:
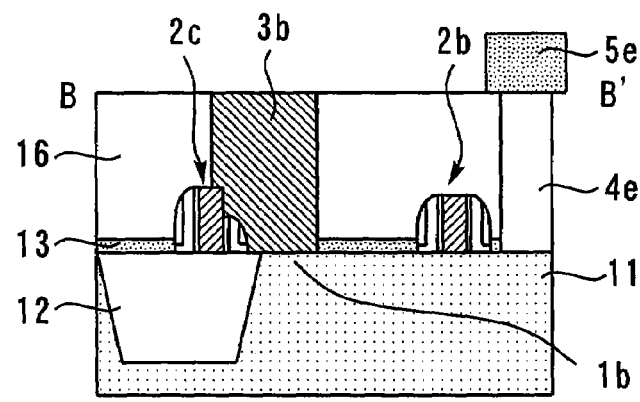
FIG. 9C is a cross sectional view along B-B' shown in FIG. 9A.

A plane view of a semiconductor device according to this embodiment is shown in FIG. 9A. FIG. 9B shows a sectional view along A-A' of FIG. 9A. FIG. 9C shows a sectional view along B-B' of FIG. 9A. Here, differences from First and Second Embodiments will be mainly explained.

As shown in FIG. 9A, a local wiring 9a is provided between a drain $D_1$ (active region 1a) and drain $D_2$ (active region 1b). As shown in FIG. 9B, one side of the local wiring 9a is connected to the active region 1a and the other side is connected to the active region 1b. In this way, the active region 1a and active region 1b are connected by the local wiring 9a.

Other parts of the configuration are the same as those of First Embodiment and explanations thereof will be omitted.

This embodiment adopts a structure whereby grooves are formed on an element isolator between the drain $D_1$ and drain $D_2$ and local wirings are provided in the grooves.

This eliminates the necessity for providing an inter-layer insulating film to form local wirings. Therefore, it is possible to reduce the number of steps compared to First Embodiment.

Figure 10A:
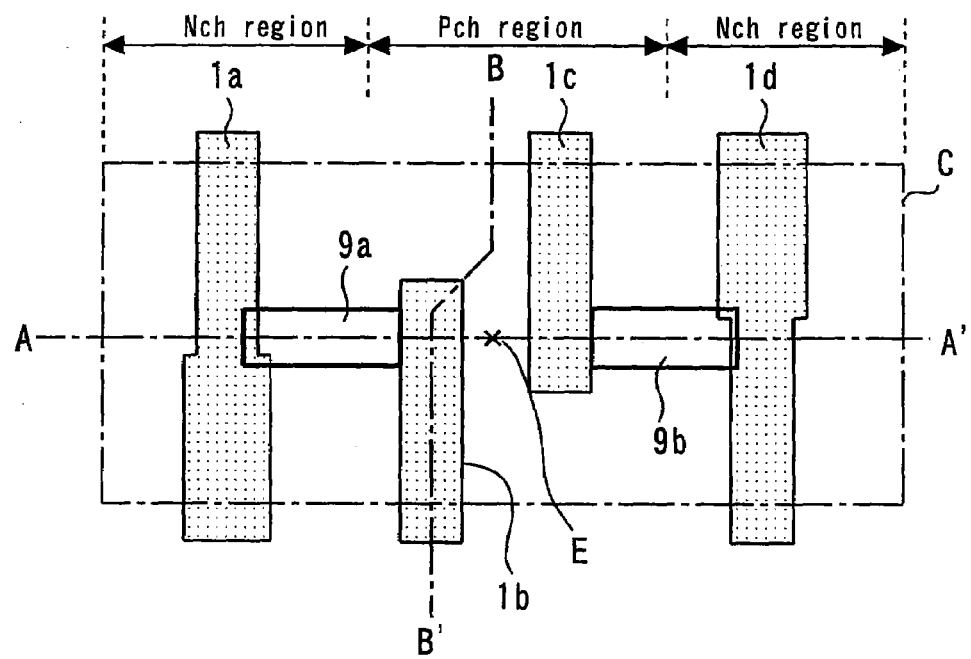
FIGS. 10A, 11A and 12A are plane views of the semiconductor device showing the method of manufacturing the semiconductor device according to the third embodiment.

Next, the method of manufacturing the semiconductor device shown in FIG. 9 will be explained with reference to FIGS. 10 to 12. "A" in these figures shows a plane view of parts corresponding to those in FIG. 9A. Furthermore, "B" and "C" in these figures are sectional views corresponding to FIGS. 9B and 9C respectively.

First, steps of forming a trench and steps of forming the active regions 1a to 1d (see FIGS. 2A, 2B and 2C) will be performed using a method similar to that shown in First Embodiment.

Next, grooves are formed by selectively etching the surface of an element isolator 12 between the active region 1a and active region 1b shown in FIG. 2B to a depth of approximately 30 nm from the top surface. Next, a silicon film is formed over the whole surface so as to fill the interior of the grooves. Next, impurities are ion-injected into the silicon film. Next, the silicon film is etched back and the silicon film outside the grooves is removed. As a result, as shown in FIG. 10B, a wiring 9a connecting the active region 1a and active region 1b is formed in the groove on the element isolator 12.

Figure 10B:
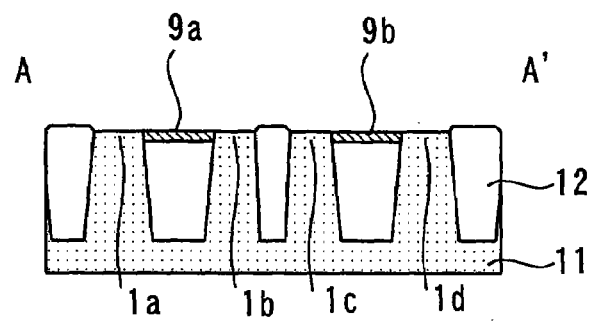
FIGS. 10B, 11B and 12B are cross sectional views along A-A' shown in FIGS. 10A, 11A and 12A respectively.
Figure 10C:
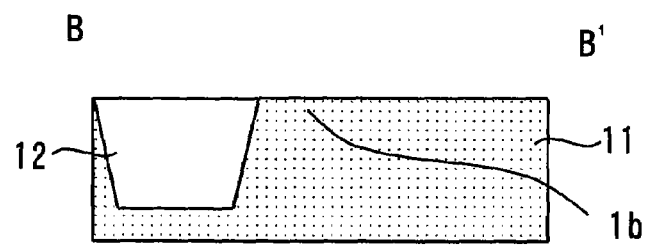
FIGS. 10C, 11C and 12C are cross sectional views along B-B' shown in FIGS. 10A, 11A and 12A respectively.

Next, gates are formed on the silicon substrate 11 shown in FIGS. 10B, 10C. As a result, the structure shown in FIG. 11 is obtained.

A gate 2a which is separated from the wiring 9a and which crosses the active region 1a is formed. Separated from the gate 2a and wiring 9a, a gate 2b is formed opposite the gate 2a with the wiring 9a placed in between. The gate 2b crosses the active region 1a and active region 1b. Separated from the gate 2a, gate 2b and wiring 9a, a gate 2c is formed. The left end thereof is opposed to the right end of the gate 2a and retreated from the gate 2a more than the left end of the active region 1b.

Figure 12A:
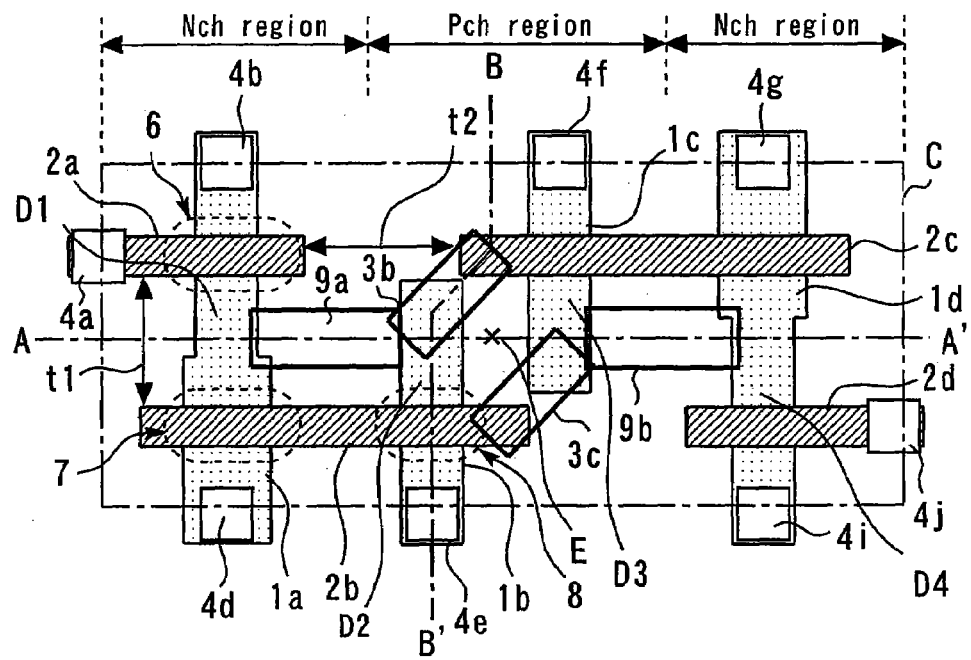

Next, ion-injection of impurities and thermal treatment are performed. As a result, as shown in FIG. 12A, the drain $D_1$ is formed between the gate 2a and gate 2b in the active region 1a. Furthermore, the drain $D_2$ is formed in the active region 1b on the drain $D_1$ side of the gate 2b.

Figure 11A:
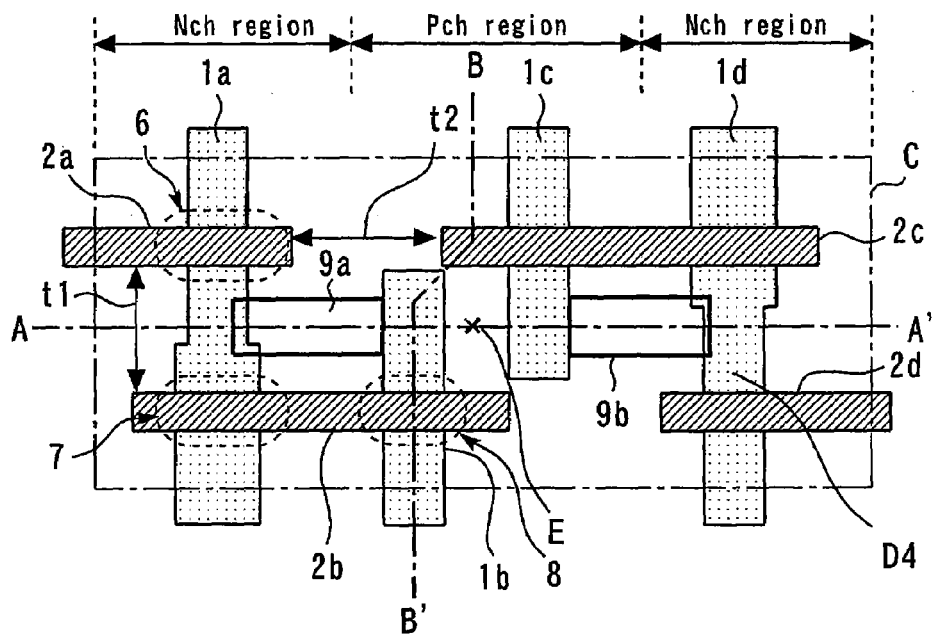
Figure 11B:
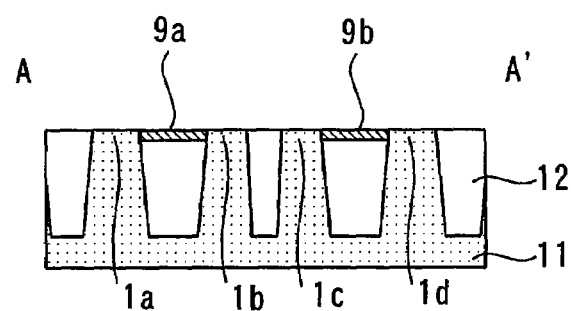
Figure 11C:
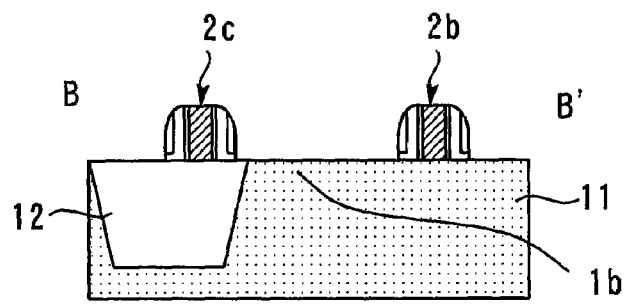
Figure 12B:
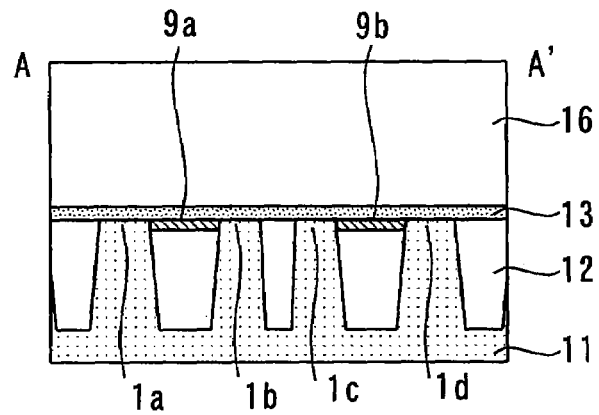

Next, a liner film made of a silicon nitride film is formed on the silicon substrate 11 shown in FIGS. 11B, 11C to a film thickness of approximately 30 nm. Next, a third inter-layer insulating film made of a silicon oxide film is formed on the liner film to a film thickness of approximately 300 to 400 nm. Next, the third inter-layer insulating film and liner film are selectively etched and to form grooves.

Next, a titanium nitride (TiN) film is formed as a barrier metal that covers the bottom face and the side of these grooves and tungsten (W) is embedded in the interior thereof to form a conductive film. It is also possible to use tantalum nitride (TaN) as the above described barrier metal and copper (Cu) is embedded in the interior thereof to form a conductive film.

Next, this conductive film is etched back and the conductive film outside the grooves is removed. Here, it is also possible to use CMP to remove the conductive film outside the grooves instead of etching back.

Figure 12C:
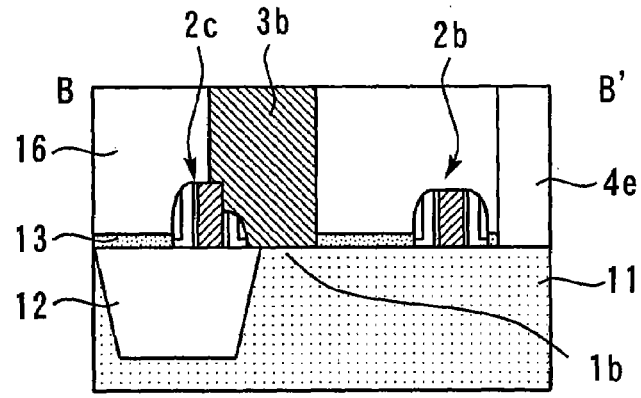

As a result, as shown in FIG. 12C, the shared contact 3b and contact 4e are formed inside the liner film 13 and third inter-layer insulating film 16.

Next, metal wirings are formed on the contact 4e in the same way as First Embodiment. As a result, the structure shown in FIG. 9 is obtained.

The manufacturing method according to this embodiment eliminates the necessity for providing inter-layer insulating films to form local wirings. Thus, compared to First Embodiment, it is possible to reduce the number of steps.

Fourth Embodiment

Figure 13A:
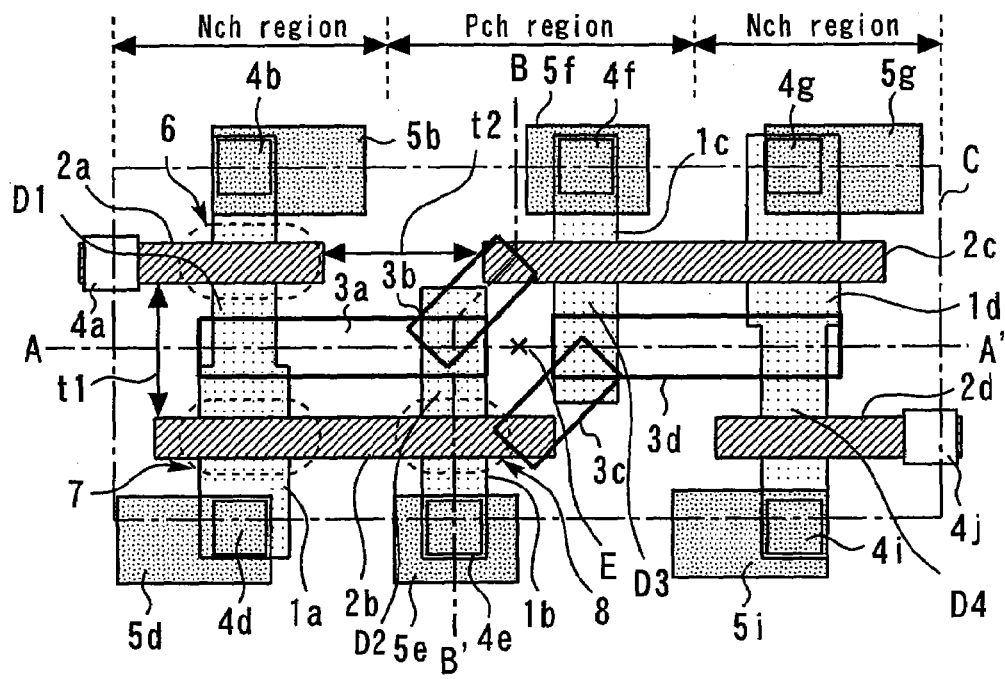
FIG. 13A is a plane view of the semiconductor device according to the fourth embodiment.
Figure 13B:
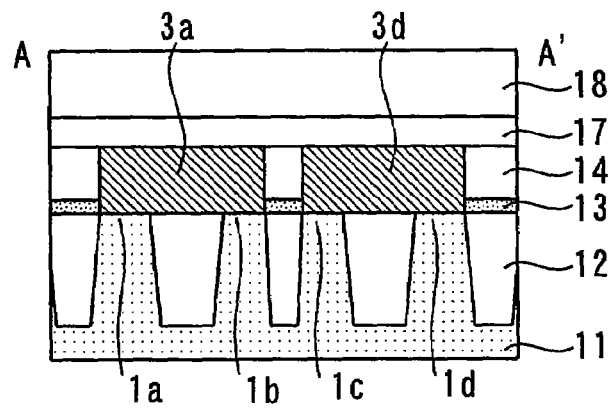
FIG. 13B is a cross sectional view along A-A' shown in FIG. 13A.
Figure 13C:
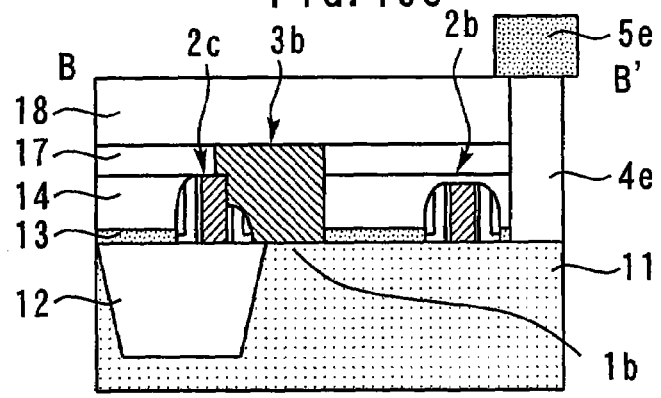
FIG. 13C is a cross sectional view along B-B' shown in FIG. 13A.

FIG. 13A shows a plane view of a semiconductor device according to this embodiment. FIG. 13B shows a sectional view along A-A' of FIG. 13A. FIG. 13C shows a sectional view along B-B' of FIG. 13A. Here, differences from First to Third Embodiments will be mainly explained.

As shown in FIG. 13B, a first inter-layer insulating film 14 made of a silicon oxide film is formed on a liner film 13. A fourth inter-layer insulating film 17 and fifth inter-layer insulating film 18 made of a silicon oxide film are laminated thereon. Local wirings 3a, 3d are provided inside the liner film 13 and first inter-layer insulating film 14. The top surface of the first inter-layer insulating film 14 and the top surfaces of the local wirings 3a, 3d have substantially the same height.

As shown in FIG. 13C, a shared contact 3b is formed inside the liner film 13, first inter-layer insulating film 14 and fourth inter-layer insulating film 17. The top surface of the shared contact 3b and the top surface of the fourth inter-layer insulating film 17 have substantially the same height. A contact 4e is provided inside the liner film 13, first inter-layer insulating film 14, fourth inter-layer insulating film 17 and fifth inter-layer insulating film 18. The top surface of the contact 4e and the top surface of the fifth inter-layer insulating film 18 have substantially the same height.

From FIGS. 13B, 13C, the local wiring 3a, shared contact 3b and contact 4e have different heights. That is, these are formed of different layers.

Other parts of the configuration are the same as those of Second Embodiment and explanations thereof will be omitted.

The shared contact 3b and contact 4e in the above described structure have different heights from the silicon substrate 11. That is, these contacts are formed in different etching steps.

This allows an over etching time to be optimized in the respective etching steps. Therefore, it is possible to facilitate steps of forming the respective contacts.

Figure 14A:
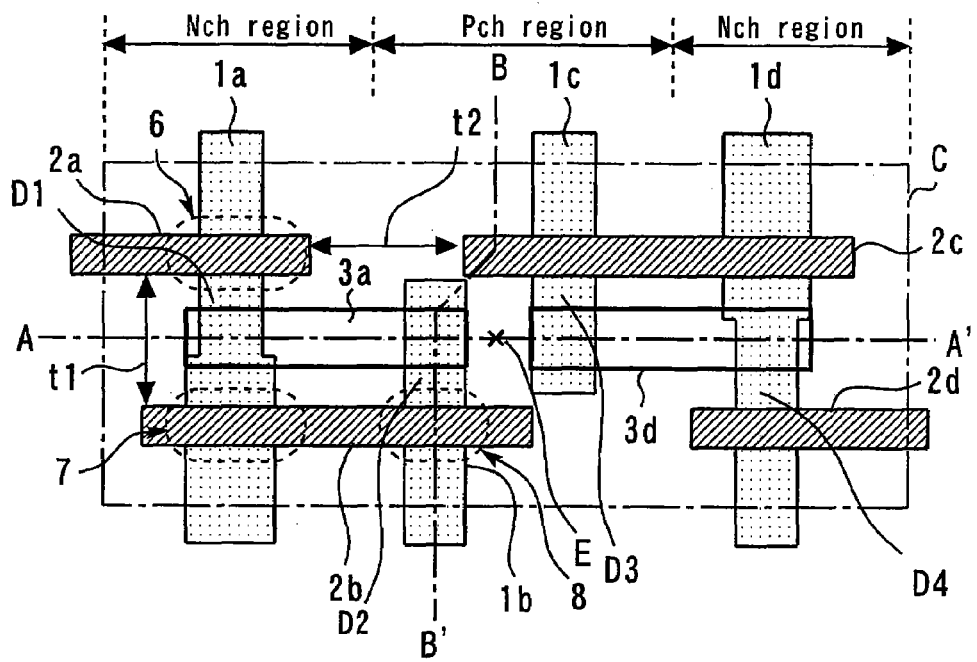
FIGS. 14A, 15A and 16A are plane views of the semiconductor device showing the method of manufacturing the semiconductor device according to the fourth embodiment.

Next, the method of manufacturing the semiconductor device shown in FIG. 13 will be explained with reference to FIGS. 14 to 16.

"A" in these figures shows a plane view of parts corresponding to FIG. 13A. Furthermore, "B" and "C" in these figures show sectional views of parts corresponding to those in FIGS. 13B and 13C respectively.

First, steps of forming a trench (see FIGS. 2A, 2B and 2C) to steps of forming gates 2a to 2d (see FIGS. 3A, 3B and 3C) will be performed using a method similar to that shown in First Embodiment. Next, a liner film is formed on the silicon substrate 11 shown in FIGS. 3B, 3C.

Next, the first inter-layer insulating film made of a silicon oxide film is formed on the liner film to the height of the gates 2a to 2d or a greater film thickness. Next, the first inter-layer insulating film and liner film are selectively etched to form grooves.

Next, a titanium nitride (TiN) film is formed as a barrier metal to cover the bottom face and side of these grooves and tungsten (W) is embedded in the interior thereof to form a conductive layer. It is also possible to use tantalum nitride (TaN) as the above described barrier metal and embed copper (Cu) in the interior thereof to form a conductive layer.

Next, this conductive layer is etched back and the conductive layer outside the grooves is removed. Here, instead of etching back, CMP may be used to remove the conductive layer outside the grooves.

Figure 14B:
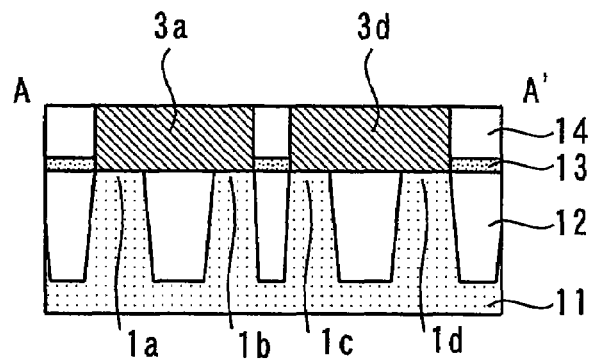
FIGS. 14B, 15B and 16B are cross sectional views along A-A' shown in FIGS. 14A, 15A and 16A respectively.
Figure 14C:
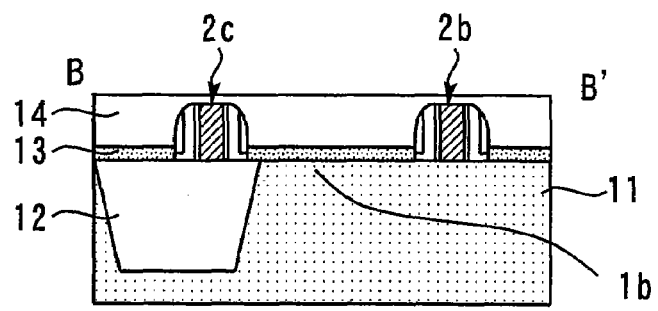
FIGS. 14C, 15C and 16C are cross sectional views along B-B' shown in FIGS. 14A, 15A and 16A respectively.

As a result, as shown in FIG. 14B, the local wirings 3a, 3d are formed inside the liner film 13 and first inter-layer insulating film 14.

Next, the fourth inter-layer insulating film made of a silicon oxide film is formed on the first inter-layer insulating film 14, local wirings 3a, 3d shown in FIG. 14B to a film thickness of approximately 100 to 200 nm. Next, the fourth inter-layer insulating film, first inter-layer insulating film 14 and liner film 13 are selectively etched to form grooves. A metal film such as a W film is embedded in the inner surface thereof. Next, the metal film formed outside the grooves is removed through CMP or the like. As a result, as shown in FIG. 15B, the shared contact 3b is formed inside the liner film 13, first inter-layer insulating film 14 and fourth inter-layer insulating film 17.

Figure 15A:
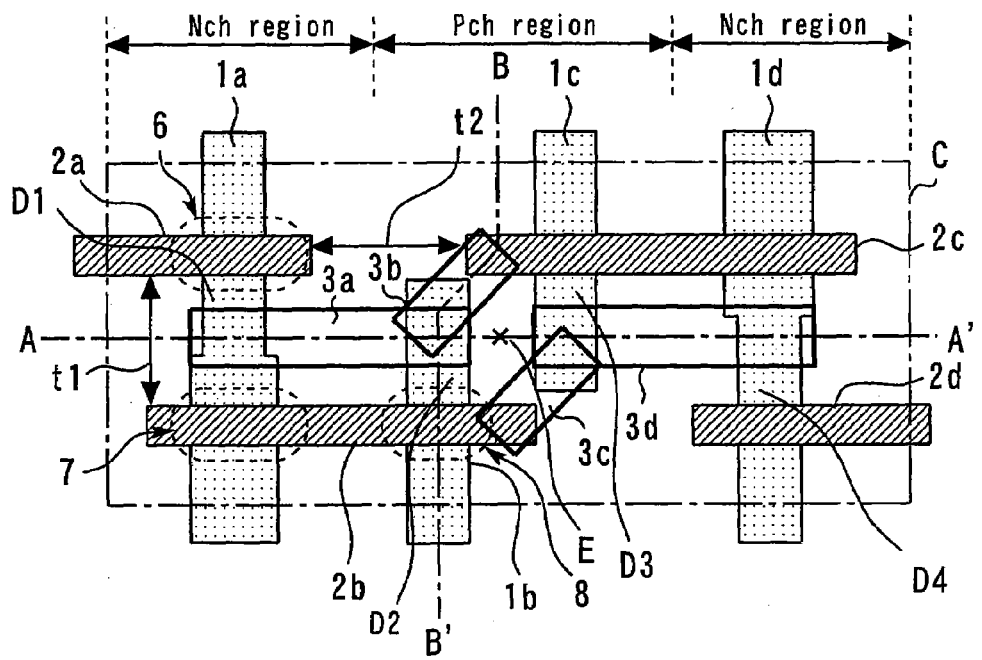
Figure 15B:
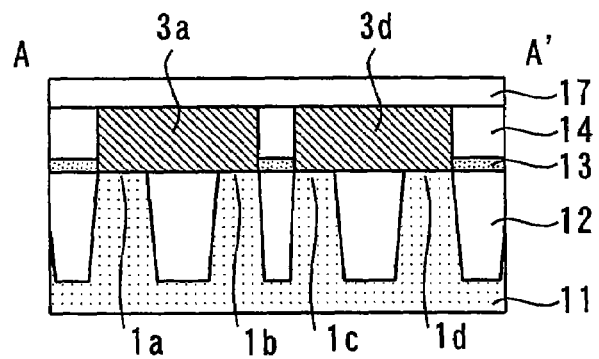
Figure 15C:
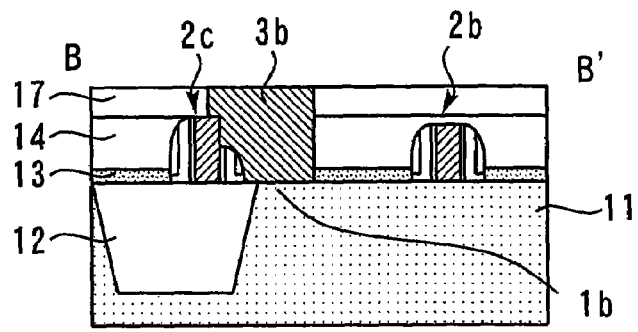
Figure 16A:
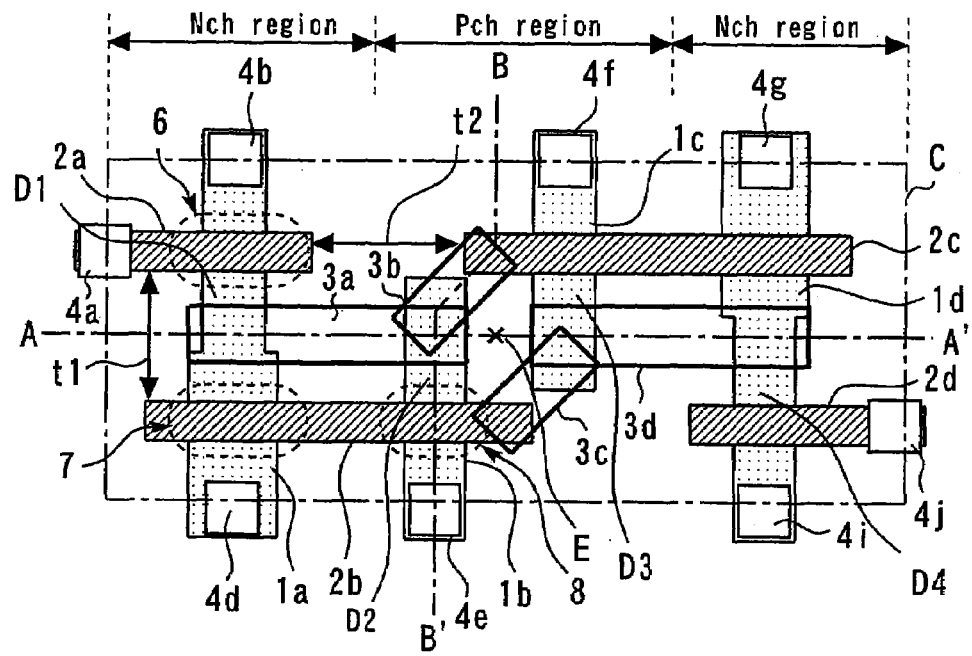
Figure 16B:
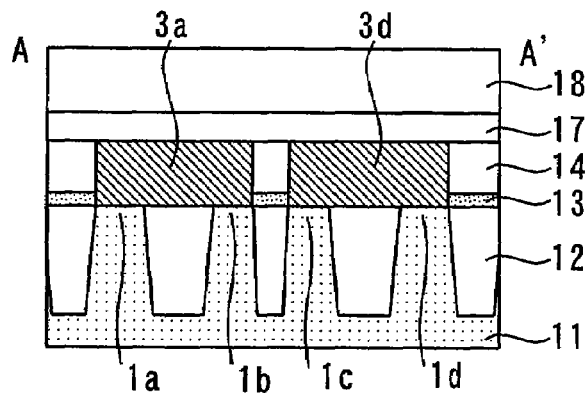
Figure 16C:
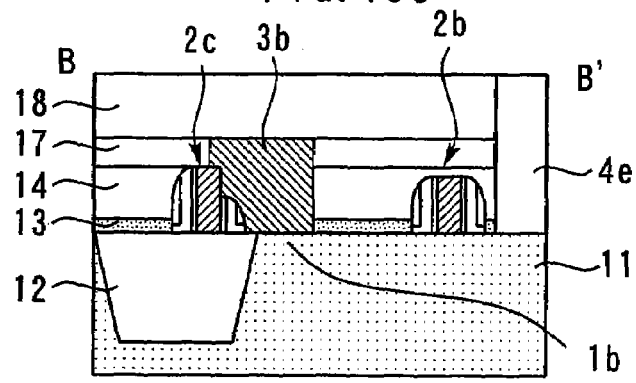

Next, the fifth inter-layer insulating film made of a silicon oxide film is formed on the fourth inter-layer insulating film 17 shown in FIGS. 15B, 15C to a film thickness of approximately 200 to 300 nm. Next, the surface of this film is planarized through CMP. Next, the fifth inter-layer insulating film, fourth inter-layer insulating film 17, first inter-layer insulating film 14 and liner film 13 are selectively etched to open contact holes. A barrier metal film such as a TiN film is formed on the inner surface thereof and a conductive film such as a W film is further embedded. Next, the barrier metal film outside the contact holes and conductive film are removed through CMP or the like. As a result, as shown in FIG. 16, contacts 4a, 4b, 4d, 4e, 4f, 4g, 4i and 4j are formed.

According to this embodiment, when the local wiring 3a, shared contact 3b and contact 4e are formed, the etching steps of forming the respective grooves (or hole patterns) can be performed separately. This allows the over etching time to be optimized in the respective etching steps.

After this, the metal wirings are formed in the same way as First Embodiment. As a result, the structure shown in FIG. 13 is obtained.

Using the above described manufacturing method, when forming the local wirings, shared contacts and contacts, it is possible to optimize the over etching time in the etching steps of forming the respective grooves (or hole patterns).

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2005-295258, filed on Oct. 7, 2005 including specification, claims, drawings and summary, on which the Convention priority of the present application is based, are incorporated herein by reference in its entirety.

The invention claimed is:

1. A semiconductor device comprising:
   a substrate;
   a first active region provided in a memory cell region on said substrate;
   a second active region which is separated from said first active region by an element isolator and provided at a position closer to a center of said memory cell region than said first active region;
   a first gate electrode which crosses said first active region;
   a second gate electrode which is separated from said first gate electrode and crosses said first active region and said second active region;
   a third gate electrode which is separated from said first gate electrode and said second gate electrode, an end of which is opposed to an end of said first gate electrode on said second active region side and retreated from said first gate electrode more than an end of said second active region opposed to said first gate electrode;
   a first drain section between said first gate electrode and said second gate electrode in said first active region;
   a second drain section at the position of a same side of said first drain toward said second gate electrode in said second active region;
   a first wiring which connects said first drain section and said second drain section; and
   a second wiring which connects said second drain section and said third gate electrode.

2. The semiconductor device according to claim 1, further comprising:
   a first insulating film on said substrate; and
   a first groove and a second groove formed in said first insulating film, wherein said first wiring is formed in said first groove and said second wiring is formed in said second groove.

3. The semiconductor device according to claim 1, further comprising:
   a first insulating film formed on said substrate;
   a first groove formed in said first insulating film, wherein said first wiring is formed in said first groove;
   a second insulating film formed on said substrate and said first wiring;
   a second groove formed in said second insulating film and said first insulating film, wherein said second wiring is formed in said second groove.

4. The semiconductor device according to claim 1, wherein said first wiring and said second wiring are formed of an identical layer.

5. The semiconductor device according to claim 1, wherein said first wiring and said second wiring are formed of different layers.

* * * * *